(12) United States Patent
Quest-Matt et al.

(10) Patent No.: US 12,165,950 B2
(45) Date of Patent: Dec. 10, 2024

(54) POWER SEMICONDUCTOR COMPONENT AND METHOD FOR PRODUCING A POWER SEMICONDUCTOR COMPONENT

(71) Applicant: Vitesco Technologies GmbH, Regensburg (DE)

(72) Inventors: Christina Quest-Matt, Munich (DE); Detlev Bagung, Munich (DE); Daniela Wolf, Munich (DE)

(73) Assignee: Vitesco Technologies GmbH, Hannover (DE)

( * ) Notice: Subject to any disclaimer, the term of this patent is extended or adjusted under 35 U.S.C. 154(b) by 0 days.

(21) Appl. No.: 17/768,044

(22) PCT Filed: Oct. 6, 2020

(86) PCT No.: PCT/EP2020/078018
§ 371 (c)(1),
(2) Date: Apr. 11, 2022

(87) PCT Pub. No.: WO2021/069450
PCT Pub. Date: Apr. 15, 2021

(65) Prior Publication Data
US 2024/0096738 A1 Mar. 21, 2024

(30) Foreign Application Priority Data
Oct. 10, 2019 (DE) ............... 10 2019 215 523.5

(51) Int. Cl.
*H01L 23/373* (2006.01)
*H01L 23/00* (2006.01)
(Continued)

(52) U.S. Cl.
CPC ...... *H01L 23/3736* (2013.01); *H01L 23/3737* (2013.01); *H01L 23/49822* (2013.01);
(Continued)

(58) Field of Classification Search
CPC ............. H01L 23/3736; H01L 23/3737; H01L 23/49822; H01L 24/32; H01L 24/83;
(Continued)

(56) References Cited

U.S. PATENT DOCUMENTS 5,019,941 A   5/1991 Craft
5,727,727 A   3/1998 Ead
(Continued)

FOREIGN PATENT DOCUMENTS

DE          4332752 A1    3/1995
DE      102007062167 A1   6/2009
(Continued)

OTHER PUBLICATIONS

Lotstopplack [Solder stop mask]—The free Encyclopedia, Processing status Jun. 3, 2019, in Internet: https://de.wikipedia.org/wiki/L%C3%B6tstopplack—English version—Retrieved from "https://en.wikipedia.org/w/index.php?title=Solder_mask&oldid=1121903189".

(Continued)

*Primary Examiner* — Patricia D Valenzuela
(74) *Attorney, Agent, or Firm* — Laurence A. Greenberg; Werner H. Stemer; Ralph E. Locher

(57) ABSTRACT

A power semiconductor component includes at least one power semiconductor device disposed within a housing and a heat sink having an area a exposed on a first surface of the housing. A wiring substrate has a first main surface and a second main surface. A heat dissipation region with increased thermal conductivity is disposed on the second main surface. The heat dissipation region has an area A on the second main surface, and a<A. The housing with the power semiconductor device is disposed on the second main surface of the wiring substrate in such a way that the heat sink is disposed completely on the heat dissipation region (Continued)

and is connected thereto by way of a solder layer. A method for producing a power semiconductor component is also provided.

12 Claims, 2 Drawing Sheets

(51) Int. Cl.
*H01L 23/498* (2006.01)
*H05K 1/02* (2006.01)
*H05K 3/34* (2006.01)

(52) U.S. Cl.
CPC .............. *H01L 24/32* (2013.01); *H01L 24/83* (2013.01); *H01L 2224/32225* (2013.01); *H01L 2224/83801* (2013.01); *H05K 1/0206* (2013.01); *H05K 3/341* (2013.01)

(58) Field of Classification Search
CPC . H01L 2224/32225; H01L 2224/83801; H01L 23/36; H01L 23/49562; H01L 23/3677; H01L 21/50; H05K 1/0204; H05K 1/0209; H05K 3/341; H05K 1/0206
See application file for complete search history.

(56) References Cited

U.S. PATENT DOCUMENTS

| | | |
|---|---|---|
| 5,792,677 A | 8/1998 | Reddy et al. |
| 6,222,732 B1 | 4/2001 | Jakob et al. |
| 7,026,664 B2 | 4/2006 | Divakar et al. |
| 8,446,726 B2 | 5/2013 | Schloerke et al. |
| 9,107,290 B1 | 8/2015 | Chen |
| 9,565,758 B2 | 2/2017 | Cho |
| 10,912,186 B2 | 2/2021 | Sato et al. |
| 2005/0263318 A1* | 12/2005 | Yoshioka ............ H05K 1/0206 174/252 |
| 2010/0238633 A1 | 9/2010 | Michenfelder et al. |
| 2012/0106086 A1* | 5/2012 | Schloerke ............ H01L 23/24 361/728 |
| 2020/0098660 A1 | 3/2020 | Wakaiki et al. |

FOREIGN PATENT DOCUMENTS

| | | | |
|---|---|---|---|
| DE | 102011085282 A1 | | 5/2012 |
| DE | 102016104813 | * | 9/2016 |
| DE | 102016104813 A1 | | 9/2016 |
| DE | 112016005508 T5 | | 9/2018 |
| DE | 112018002707 T5 | | 2/2020 |
| EP | 0558712 A1 | | 9/1993 |
| EP | 1676316 A1 | | 7/2006 |
| JP | 2003318579 A | | 11/2003 |
| JP | 2014229804 | * | 12/2014 |
| JP | 2014229804 A | | 12/2014 |
| JP | 2018120991 A | | 8/2018 |

OTHER PUBLICATIONS

"Power MOSFET", Wikipedia, pp. 1-6, https://de.wikipedia.org/wiki/Leistungs-MOSFET.

Gulino, "Guidelines for Using ST's MOSFET SMD Pagages", AN1703-Application Note, 2003, pp. 1-22, STMicroelectronics, Italy.

* cited by examiner

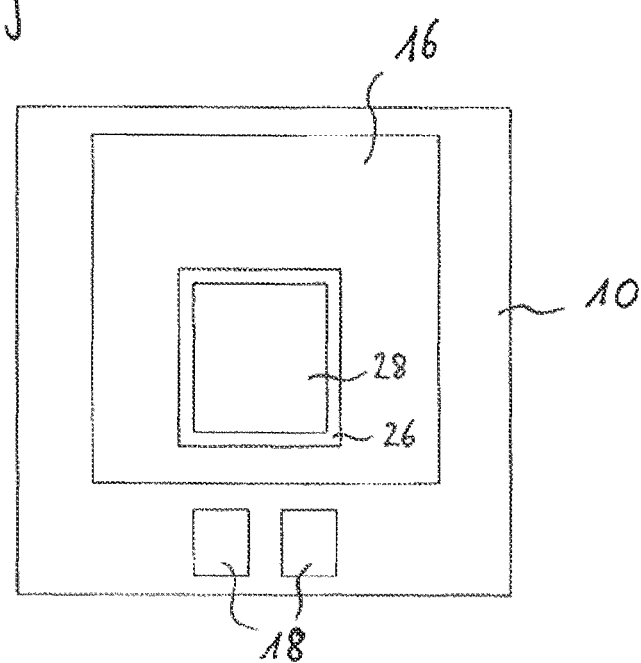

POWER SEMICONDUCTOR COMPONENT AND METHOD FOR PRODUCING A POWER SEMICONDUCTOR COMPONENT

Field and Background of the Invention

Summary of the Invention

The present invention relates to a power semiconductor component having a power semiconductor device arranged within a housing, and also to a method for producing a power semiconductor component.

Power semiconductor devices such as for example MOSFETs are arranged in housings, typically plastic housings, with cooling surfaces, for example made of copper, exposed on the outer side of the housing, there being a number of different housing designs, such as for example D2PAK, DPAK, TO220, etc. The devices are designed in some instances as surface-mountable devices and in some instances as through-hole-mountable devices. Said devices typically have at least two connection pins which are led out of the plastic housing and which can be connected to connections of a wiring substrate.

Since power semiconductor components having such power semiconductor devices emit large quantities of heat during operation, the efficient dissipation of this heat is a particular challenge. Typically, the heat is dissipated by way of the wiring substrate on which the packaged power semiconductor device is arranged. For this purpose, the latter may have thermal holes (vias), for example.

In some more recent applications, for example in chargers used in electric vehicles, very high power losses occur, such that cooling is of particular importance. In some instances, the use of thermal holes is not actually possible in such applications due to electrical insulation regulations. A component of this type is known from JP 2018-120 991 A, for example.

JP 2014-229 804 A discloses a power semiconductor module in which a power semiconductor device is soldered by its heat sink on a metallization of the wiring substrate. A housing part formed from metal makes contact with the metallization by way of a layer composed of thermally conductive material, such that heat can be dissipated to the housing.

It is an object of the present invention to specify a power semiconductor component which has a particularly effective dissipation of heat emitted by the power semiconductor device. Furthermore, the intention is to specify a method for producing such a power semiconductor component.

This object is achieved by means of the subject matter of the independent claims. The dependent claims relate to advantageous embodiments and developments.

In accordance with one aspect of the invention, what is specified is a power semiconductor component having at least one power semiconductor device arranged within a housing, wherein a heat sink having an area a is exposed on a first surface of the housing. The housing is in particular a plastic housing. The heat sink is formed in particular from metal. The housing can for example have substantially a cuboid shape.

The power semiconductor component furthermore has a wiring substrate having a first main surface and a second main surface, wherein a heat dissipation region with increased thermal conductivity is arranged on the second main surface, wherein the heat dissipation region has an area A on the second main surface. The wiring substrate can be in particular a circuit board, for example a PCB substrate, i.e. a printed circuit board. The heat dissipation region can be formed in particular from copper or a copper alloy. By way of example, the heat dissipation region is formed by a segment of a copper layer of the circuit board, for example by a copper surface of the copper layer arranged on a main surface of the circuit board.

The area a of the heat sink is less than the area A of the heat dissipation region. In particular, it holds true that a<0.75 A, in particular a<0.5 A, i.e. A can have a size more than double that of a.

The housing with the semiconductor device is arranged on the second main surface of the wiring substrate in such a way that the heat sink is arranged completely on the heat dissipation region and is connected thereto by way of a solder layer. In one advantageous configuration, the solder layer is advantageously arranged in the heat dissipation region both within a mounting region corresponding in terms of shape and extent to the first surface of the housing to be applied, and outside said mounting region.

Accordingly, the heat dissipation region on the wiring substrate projects laterally beyond the area of the heat sink. The heat dissipation region is accordingly larger than would be necessary for applying the housing with the power semiconductor device and for electrical and thermal linking.

The power semiconductor component has the advantage that as a result of the enlarged heat dissipation region, the mass of material having good thermal conductivity, in particular copper, on the wiring substrate is greatly increased. It can be more than doubled, in particular. In this way, not only is the heat effectively dissipated from the power semiconductor device, but effective heat spreading takes place, too, by virtue of the fact that heat can be dissipated laterally into all parts of the heat dissipation region and be emitted to the surroundings there. Heat is dissipated from the power semiconductor device particularly effectively in this way.

In addition to the larger area, the thickness of the heat dissipation region can also be increased. Typically, with standard circuit board technology, a maximum of 70 micrometers of copper is available per layer, in some instances even up to 105 micrometers or up to 201 micrometers. This maximum thickness can be fully exploited for the heat dissipation region in order to maximize the heat-conducting mass.

In addition, the large quantity of material with good thermal conductivity in the heat dissipation region constitutes a buffer in order to absorb momentary power peaks of the power semiconductor device that bring about a momentary rise in temperature.

In accordance with one embodiment, the material forming the heat dissipation region, in particular copper or a copper alloy, is embedded in a matrix composed of plastics material, and the surface of the heat dissipation region is in this case preferably coplanar with the rest of the surface of the wiring substrate. Alternatively, the heat dissipation region could also rest on a surface of the wiring substrate.

In accordance with one embodiment, an additional region of the heat sink is exposed on a side surface of the housing and is covered with a heat dissipating mass composed of thermally conductive material.

A side surface of the housing is understood hereinafter to mean an outer surface of the housing arranged perpendicular to the first surface. Such a side surface is not directly in contact with the wiring substrate in the mounted state. Applying the additional heat dissipating mass to the additionally exposed region of the heat sink improves the heat dissipation even further.

Often the heat sink is not just exposed on a side surface, but rather even protrudes from the housing and thus projects from the side surface. In this case, the entire projecting region can be covered with the heat dissipating mass.

The material forming the heat dissipating mass can be in particular solder or silver conductive adhesive. These materials are materials which are available anyway in semiconductor technology and which are easy to handle, can readily be applied as a heat dissipating mass and have a good thermal conductivity.

In accordance with a further aspect of the invention, a method for producing the power semiconductor component described is specified, wherein the method comprises providing at least one power semiconductor device arranged within a housing, wherein a heat sink is exposed on a first surface of the housing, wherein the heat sink has an area a on the first surface.

Furthermore, the method comprises providing a wiring substrate having a first main surface and a second main surface, wherein a heat dissipation region with increased thermal conductivity is arranged on the second main surface, wherein the heat dissipation region has an area A on the second main surface, wherein a<A holds true.

The method furthermore comprises applying solder resist to the wiring substrate in the heat dissipation region, wherein the solder resist delimits a mounting region for receiving the housing with the power semiconductor device. In this case, the mounting region corresponds in terms of shape and extent to the first surface of the housing to be applied.

This is followed by applying a solder layer to the heat dissipation region and attaching the housing with the power semiconductor device in the mounting region by soldering. In this case, in order to increase the quantity of material having a good thermal conductivity, the solder layer is applied both within and outside the mounting region and thus on both sides of the delimitation composed of solder resist, wherein solder outside the mounting region serves merely for heat dissipation and heat spreading, and not for fixing the housing.

Further regions composed of solder resist can be provided in the heat dissipation region or outside the latter on the wiring substrate, as is known from the prior art.

The solder layer can in particular be printed onto the heat dissipation region.

The solder resist layer has the task of preventing the housing with the power semiconductor device from floating during the soldering process. The solder resist layer accordingly fixes the housing during the soldering process.

The solder layer has substantially the same extent as the heat dissipation region. It can be somewhat smaller in order to prevent solder from escaping into regions outside the heat dissipation region. Accordingly, however, the solder layer has an area B that is significantly greater than a and approximately equal to A.

In accordance with one aspect of the invention, a method for producing the power semiconductor component described comprises providing at least one power semiconductor device arranged within a housing, wherein a heat sink is exposed on a first surface of the housing, wherein the heat sink has an area a on the first surface. Furthermore, the method comprises providing a wiring substrate having a first main surface and a second main surface, wherein a heat dissipation region with increased thermal conductivity is arranged on the second main surface, wherein the heat dissipation region has an area A on the second main surface, wherein a<A holds true.

Furthermore, the method comprises applying the housing with the power semiconductor device to the wiring substrate in the heat dissipation region by means of an SMD adhesive and applying a solder layer to the wiring substrate in the heat dissipation region.

An SMD adhesive is understood here to mean an adhesive which is used to fix surface-mountable components (surface-mount devices). Such adhesives, which may for example be electrically conductive adhesives based on epoxy resin, are known in principle to those skilled in the art and are therefore not explained in more detail at this point.

In this case, the SMD adhesive serves for fixing the housing with the power semiconductor device during the subsequent process of attaching the housing with the power semiconductor device in the mounting region by soldering.

In accordance with one embodiment, after attaching the housing with the power semiconductor device by soldering, an additional region of the heat sink exposed on a side surface of the housing, after the housing has been applied to the wiring substrate, is covered with a heat dissipating mass composed of thermally conductive material.

In this case, the heat dissipating mass can be applied before or after the housing with the power semiconductor device has been attached by soldering. It can consist in particular of solder material or thermally conductive adhesive, for example silver adhesive.

Embodiments of the invention will be described by way of example below with reference to schematic drawings.

DETAILED DESCRIPTION OF THE INVENTION

Figure 1:
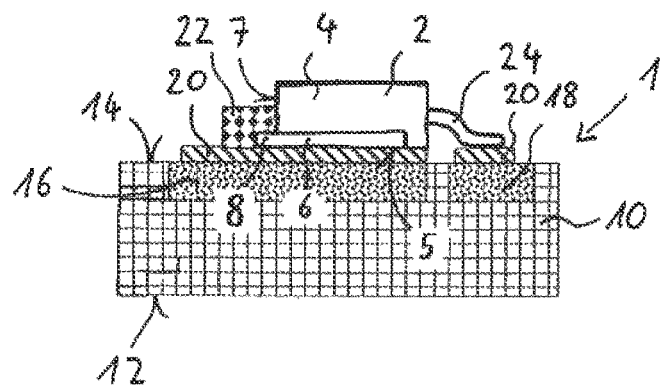
FIG. 1 schematically shows a power semiconductor component in accordance with one embodiment of the invention in cross section.

The power semiconductor component 1 in accordance with FIG. 1 has a power semiconductor device 2, of which only a plastic housing 4 is shown in FIG. 1, and also connection pins 24 protruding from the plastic housing 4 and a heat sink 6 exposed on a first surface 5 of the housing 4. The power semiconductor device 2 additionally has at least one power semiconductor chip, for example a MOSFET, which is thermally and possibly also electrically connected to the heat sink 6. The power semiconductor device 2 is contacted by way of the connection pins 24 and possibly by way of the heat sink 6.

In the embodiment shown, the power semiconductor device is a surface-mountable power semiconductor device 2. Alternatively, however, it could also be a through-hole-mountable power semiconductor device.

The power semiconductor component 1 furthermore has a wiring substrate 10, which, in the embodiment shown, is designed as a PCB substrate and has a first main surface 12 and a second main surface 14 situated opposite the latter. The wiring substrate 10 comprises substantially a matrix made of plastic, in which contact connection pads 18 for the connection pins 24, conductor tracks (not illustrated) and a heat dissipation region 16 made of copper are embedded.

The heat dissipation region 16 is exposed on a second main surface 14 of the wiring substrate 10 and is provided for receiving the power semiconductor device 2.

A solder layer 20 for the electrical and mechanical connection of the power semiconductor device 2 and the wiring substrate 10 is applied both to the heat dissipation region 16 and to the contact connection pads 8. The power semiconductor device 2, in particular the heat sink 6, is connected to the heat dissipation region 16 in an electrically and thermally conductive manner by way of the solder layer 20. The connection pins 24 are connected to the contact connection pads 18 in an electrically and thermally conductive manner by way of the solder layer 20.

A region 8 of the heat sink 6 is likewise exposed on a side surface 7 of the housing 4 and projects beyond the housing 4 in the embodiment shown. Said region 8 is covered by a heat dissipating mass 22 composed of silver adhesive. Alternatively, solder material or some other material having good thermal conductivity could also be used as the heat dissipating mass 22.

Figure 2:
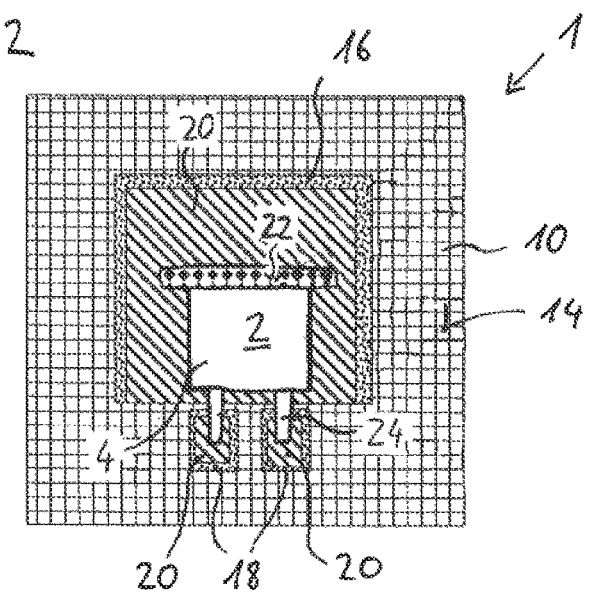
FIG. 2 schematically shows the power semiconductor component in accordance with FIG. 1 in a plan view, and FIG. 3 schematically shows the wiring substrate for the power semiconductor component in accordance with FIGS. 1 and 2 before a housing with a power semiconductor device is applied.

FIG. 2 shows the power semiconductor component 1 in a plan view. It can be seen in this view that the heat dissipation region 16 and the solder layer 20 have a significantly larger areal extent than the housing 4 and the heat sink 6, which is not visible in FIG. 2. In the embodiment shown, the area A of the heat dissipation region 16 has more than double the size of the area a of the heat sink 6 that is exposed on the first surface 5 of the housing 4.

As can be seen in FIG. 2, the heat dissipation region 16 and the solder layer 20 arranged thereon thus protrude laterally to a significant extent beyond the housing 4. In the embodiment shown in FIG. 2, they protrude beyond the housing 4 on all sides.

The copper material of the heat dissipation region 16 and also the solder material of the solder layer 20, together with the heat dissipating mass 22, which laterally likewise protrudes beyond the region 8 of the heat sink 6, form an increased thermal mass, which can both buffer momentary temperature increases due to power peaks and, owing to its large spatial extent, achieve a good heat spreading.

FIG. 3 shows a plan view of the wiring substrate 10 for the power semiconductor component 1 before the housing 4 is applied. A mounting region 28 is defined on the surface of the heat dissipation region 16, which mounting region corresponds in terms of shape and extent to the first surface 5 of the housing 4 and is provided for receiving the housing 4.

The mounting region 28 is delimited by a solder resist web 26 in the embodiment shown in FIG. 3. The solder resist web 26 is applied to the surface of the heat dissipation region 16 before the solder layer 20 has been applied. Afterward, within and outside the solder resist web 26, i.e. both in and outside the mounting region 28, the solder layer 20 is applied, for example by printing. The solder resist web 26 prevents the housing 4 from floating on the liquid solder during the process of attaching by soldering.

In the embodiment shown, the solder resist web 26 is embodied in continuous fashion. However, it can also be embodied in interrupted fashion or in a manner made of numerous solder resist points spaced apart from one another.

The invention claimed is:

1. A power semiconductor component, comprising:
    a housing having a first surface;
    at least one power semiconductor device disposed within said housing;
    a heat sink exposed on said first surface of said housing, said heat sink having an area;
    a wiring substrate having a first main surface and a second main surface;
    a heat dissipation region disposed on said second main surface, said heat dissipation region having increased thermal conductivity and said heat dissipation region having an area on said second main surface being larger than said area of said heat sink; and
    a solder layer;
    said housing with said power semiconductor device being disposed on said second main surface with said heat sink disposed completely on said heat dissipation region and said heat sink connected to said heat dissipation region by said solder layer, said solder layer directly connecting said heat sink to said heat dissipation region.

2. The power semiconductor component according to claim 1, which further comprises a mounting region corresponding in shape and extent to said first surface of said housing, said solder layer being disposed in said heat dissipation region within said mounting region and outside of said mounting region.

3. The power semiconductor component according to claim 1, wherein said heat dissipation region is formed of copper or a copper alloy.

4. The power semiconductor component according to claim 1, wherein said heat dissipation region is formed of a material embedded in a matrix composed of plastics material.

5. The power semiconductor component according to claim 1, wherein the power semiconductor component is a circuit board arrangement, said wiring substrate is a printed circuit board having a copper layer, and said heat dissipation region is formed by a segment of said copper layer.

6. The power semiconductor component according to claim 1, wherein:
    said housing has a side surface;
    said heat sink has an additional region exposed on said side surface; and
    a heat dissipating mass composed of thermally conductive material covers said additional region.

7. The power semiconductor component according to claim 6, wherein said thermally conductive material forming said heat dissipating mass is solder.

8. The power semiconductor component according to claim 6, wherein said thermally conductive material forming said heat dissipating mass is silver conductive adhesive.

9. A method for producing a power semiconductor component, the method comprising:
    providing at least one power semiconductor device disposed within a housing;
    exposing a heat sink on a first surface of the housing, the heat sink having an area on the first surface;
    providing a wiring substrate having a first main surface and a second main surface;
    placing a heat dissipation region with increased thermal conductivity on the second main surface, the heat dissipation region having an area on the second main surface being larger than the area of the heat sink;
    applying solder resist in the heat dissipation region delimiting a mounting region for receiving the housing with the power semiconductor device;
    applying a solder layer to the wiring substrate in the heat dissipation region; and
    attaching the housing with the power semiconductor device in the mounting region by soldering, the solder layer directly connecting the heat sink to the heat dissipation region.

10. The method according to claim 9, which further comprises:
   providing an additional region of the heat sink exposed on a side surface of the housing; and
   after applying the housing with the power semiconductor device, covering the additional region with a heat dissipating mass composed of thermally conductive material.

11. A method for producing a power semiconductor component, the method comprising:
   providing at least one power semiconductor device disposed within a housing;
   exposing a heat sink on a first surface of the housing, the heat sink having an area on the first surface;
   providing a wiring substrate having a first main surface and a second main surface;
   placing a heat dissipation region with increased thermal conductivity on the second main surface, the heat dissipation region having an area on the second main surface being larger than the area of the heat sink;
   applying the housing with the power semiconductor device to the wiring substrate in the heat dissipation region by using a surface-mount device adhesive and applying a solder layer to the wiring substrate in the heat dissipation region; and
   attaching the housing with the power semiconductor device in a mounting region by soldering, the solder layer directly connecting the heat sink to the heat dissipation region.

12. The method according to claim 11, which further comprises:
   providing an additional region of the heat sink exposed on a side surface of the housing; and
   after applying the housing with the power semiconductor device, covering the additional region with a heat dissipating mass composed of thermally conductive material.

* * * * *